United States Patent [19]
Chang

[11] Patent Number: 5,280,191
[45] Date of Patent: * Jan. 18, 1994

[54] LIGHTWAVE PACKAGING FOR PAIRS OF OPTICAL DEVICES HAVING THERMAL DISSIPATION MEANS

[75] Inventor: Peter C. Chang, Allentown, Pa.

[73] Assignee: AT&T Bell Laboratories, Murray Hill, N.J.

[*] Notice: The portion of the term of this patent subsequent to Sep. 10, 2008 has been disclaimed.

[21] Appl. No.: 1,931

[22] Filed: Jan. 7, 1993

Related U.S. Application Data

[63] Continuation of Ser. No. 672,270, Mar. 20, 1991, abandoned, which is a continuation of Ser. No. 457,135, Dec. 26, 1989, Pat. No. 5,047,835.

[51] Int. Cl.[5] .................... H01L 23/02; G02B 6/30; H02B 1/00; H05K 7/20
[52] U.S. Cl. .................. 257/712; 257/718; 257/719; 257/433; 257/723; 361/679; 361/707; 361/714
[58] Field of Search ............... 357/81, 74, 80; 361/380, 388, 389; 257/712, 713, 718, 719, 723, 724, 730, 678, 433

[56] References Cited

U.S. PATENT DOCUMENTS

| | | | |
|---|---|---|---|
| 4,792,878 | 12/1988 | Buselmeier et al. | 361/388 |
| 5,043,775 | 8/1991 | Lee | 357/81 |
| 5,047,835 | 9/1991 | Chang | 357/74 |
| 5,052,005 | 9/1991 | Tanaka et al. | 357/81 |

Primary Examiner—Andrew J. James
Assistant Examiner—Carl Whitehead, Jr.
Attorney, Agent, or Firm—Wendy W. Koba

[57] ABSTRACT

An optical package particularly suited for use with a pair of optical devices is disclosed. In a preferred embodiment, the package may house an optical transmitting device and an optical receiving device such that the package forms a transceiver. The package advantageously utilizes a number of molded plastic piece parts to reduce the package cost and simplify construction. By utilizing molded components, optical alignment within the package is automatically achieved.

8 Claims, 3 Drawing Sheets

LIGHTWAVE PACKAGING FOR PAIRS OF OPTICAL DEVICES HAVING THERMAL DISSIPATION MEANS

This application is a continuation of application Ser. No. 07/672270, filed on Mar. 20, 1991 now abandoned, which is a continuation of application Ser. No. 07/457,135 filed Dec. 26, 1989 now U.S. Pat. No. 5047835.

BACKGROUND OF THE INVENTION

1. Field of the Invention

The present invention relates to lightwave packaging techniques for pairs of optical devices and, more particularly, to an optical packaging arrangement particularly suited for transceiver applications which utilizes plastic piece parts and an automated assembly process to provide cost-effective packaging.

2. Description of the Prior Art

There exist many different arrangements for packaging optical transmitters or receivers. For example, an optical device (e.g., laser, LED, APD or PIN photodiode) may be encased in an optical assembly with appropriate lensing and an optical fiber attached to the assembly. The electronics required for operating the optical device includes, for example, a modulation circuit for a transmitter or a detection circuit for a receiver. These circuits are separately assembled (on a printed wiring board, for example) and connected to the housed optical device by conventional electrical leads. Alternatively, the electronics may be fully enclosed in a separate housing, with only the leads exposed for connection to the optical device. An advantage of using separate housings is that many different electronic circuits may be connected to the same optical device. For example, the electronics for a data link application may operate with various types of logic signals (e.g., ECL or TTL) without the need for modifying the package housing to accommodate the different electronics. Additionally, if either the electrical or optical portion of a transmitter or receiver were to experience a failure, the working portion could be disconnected and re-used with another arrangement. A major disadvantage of separate packaging is the increased overall size of the transmitter or receiver. With two separate packages, or an optical package mounted on a printed wiring board, the system requires a rather large space. Further, such a system is susceptible to electrical noise introduced by the necessarily long lead lengths of the connections between the electronics and the optical device. This electrical noise factor becomes a significant concern at bit rates exceeding approximately 10 Mb/s. Also, long leads may limit the maximum bit rate of both the transmitter and receiver, due to parasitic lead inductance (limits the transmitter) and parasitic capacitance (limits the receiver).

These and other concerns have led to the development of package designs which provide for the electronics and optical device to be housed in the same unit. In particular, there exist a number of such unitary arrangements particularly suited for data link applications which utilize an LED as the transmitting device and a PIN photodiode as the receiving device. Many of these unitary packages are relatively expensive, as a result of using machined metallic components. Further, these subassemblies have been known to experience alignment difficulties. There also exist fabrication problems in mating the various piece parts (i.e., outer housing, optical subassembly and electronics). These unitary packages are also known to generate a significant amount of heat, where thermal management of optical data link transmitters and receivers has been a significant problem. Lastly, in many instances, the prior art packaging schemes are limited to either transmitter or receiver applications. Therefore, to utilize a pair of optical devices together at one site (as in a transceiver, for example) a pair of separate packages must be utilized. Again, the use of a pair of packages necessarily increases the cost, size and complexity of the system.

Thus, a need remains in the prior art for improved lightwave packaging arrangements, especially arrangements capable of housing more than one optical device.

SUMMARY OF THE INVENTION

The need remaining in the prior art is addressed by the present invention which relates to a lightwave packaging arrangement for pairs of optical devices and, more particularly, to such a packaging arrangement which utilizes plastic piece parts and an automated assembly sequence to provide cost-effective packaging.

One or more of the following features are embodied by various aspects of the present invention: (1) utilization of a molded plastic frame housing for holding both an electronic subassembly and a pair of optical subassemblies; (2) utilization of a molded plastic fiber receptacle for insertion of the optical subassemblies and alignment with communication fibers, the receptacle for mating with the plastic frame housing; (3) utilization of a metallic spring clip for holding the optical subassemblies in place within the plastic receptacle; (4) formation of the plastic receptacle so as to include both optical and electrical leads; (5) utilization of a metallic element on the underside of the package lid to provide heat sinking, EMI protection and ESD shielding; (6) formation of the metallic element to include a central partition which may be utilized to physically isolate the electronics associated with the different optical subassemblies; and (7) utilization of ultrasonic bonding techniques to quickly and efficiently join together the various plastic piece parts.

These and other features of the present invention will be described in detail below during the course of the following discussion and by reference to the accompanying drawings.

BRIEF DESCRIPTION OF THE DRAWING

Referring now to the drawings where like numerals represent like parts in several views.

DETAILED DESCRIPTION

Figure 1:
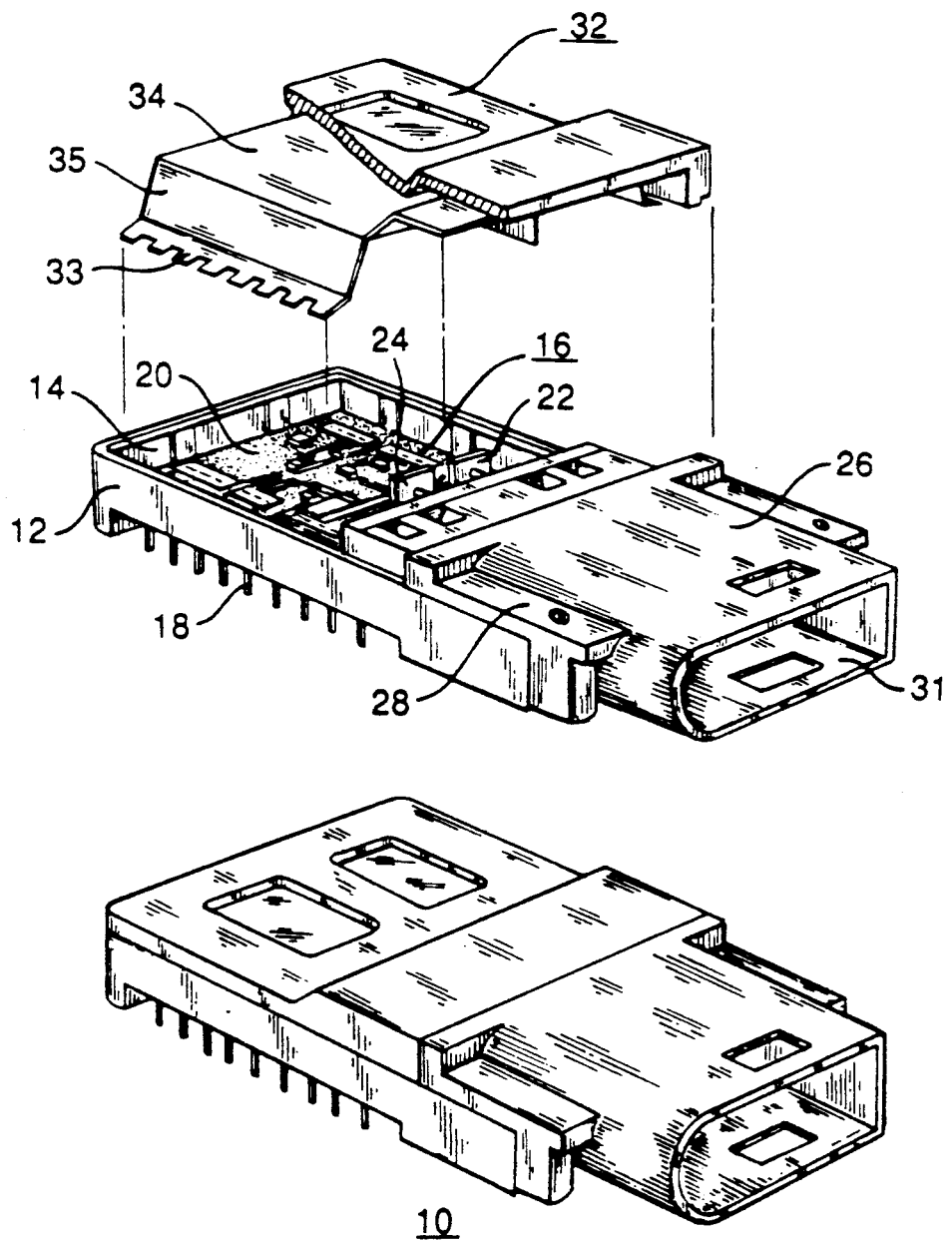
FIG. 1 illustrates an exemplary optical package formed in accordance with the present invention.

An exemplary optical package 10 formed in accordance with the present invention is illustrated in FIG. 1. As shown, package 10 comprises a frame housing 12 formed of a high performance engineering plastic material, such as the glass-reinforced material ULTEM ® 2100, sold by the General Electric Company. Frame housing 12 is molded (using injection molding, transfer molding, or compression molding, for example) to include a cavity 14 sized to accommodate an electronic subassembly 16. In particular, electronic subassembly 16 is positioned within cavity 14 such that a plurality of leads 18 protrudes below frame 12, as seen in FIG. 1. Electronic subassembly 16 includes the various electronic circuitry required for the operation of the pair of optical devices to be mounted within package 10. In particular, the circuitry may include modulation circuitry for a transmitting device and/or detection circuitry for a receiving device. In most cases, electronic subassembly 16 comprises a printed circuit board 20 with individual components and hybrid integrated circuits (HICs) mounted thereon. Alternatively, the electronics may be fully encased within either a separate dual-in-line package (DIP) or surface-mounted package which is attached to a substrate forming the floor of electronic subassembly 16.

Package 10 further comprises a pair of optical subassemblies 22,24 which are inserted within a molded plastic receptacle 26. Receptacle 26, like frame 12, being formed of an engineering plastic material. As seen in FIG. 1, frame 12 is molded to include a second cavity 28 for insertion of receptacle 26. An advantage of using molded plastic piece parts in accordance with one aspect of the present invention for frame 12 and receptacle 26 is that the shape of either part may be easily adapted for various design changes merely by modifying the mold. This advantage is particularly significant for receptacle 26, which serves as the connector to a fiber attachment (not shown), because various different attachment schemes may be utilized with only minor modifications to the mold required. The adaptation is thus a once-and-done operation (i.e., changing of the mold) as compared with prior art machined housing where a new connector (receptacle) design must be repeatedly manufactured for each package. Further, by utilizing plastic piece parts for frame 12 and receptacle 26, no secondary finishing operations, such as reaming or plating, are required to produce corrosion-resistance, high-precision parts which are needed to provide aligned between an optical fiber and optical device. Therefore, plastic molding significantly reduces the costs associated with any receptacle redesign. Referring back to FIG. 1, when receptacle 26 including optical subassemblies 22,24 is attached to frame 12, electrical leads 30 extending from optical subassemblies 22,24 may be directly attached to electronic subassembly 16 (see FIG. 2). An additional advantage of receptacle 26 is that a plurality of power pins 25 (shown in FIG. 2) may be molded directly into receptacle 26. Power pins 25 then fit through sockets in electronic subassembly 16 (see FIG. 2) and may be utilized to provide electrical power to equipment attached to receptacle 26 (e.g., electronic switching of fibers, electronic control circuitry).

A lid 32, shown separately in FIG. 1, is formed to encase both electrical subassembly 16 and optical subassemblies 22,24. Advantageously, lid 32 may include a metallic heat sink 34 attached to the interior thereof, with sidewalls 35 for contacting printed circuit board 20 when lid 32 is attached to frame 12. Lid 32 may be formed of a metal such that lid 32 and heat sink 34 are in fact a single piece part. Alternatively, lid 32 may comprise a plastic material similar to frame 12 and receptacle 26. As discussed below, the composition of lid 32 will impact the method utilized to attach lid 32 to package 10. In one particular embodiment, sidewalls 35 may include a plurality of flanged end portions 33, as shown in FIG. 1, which apply a spring-like contact force on printed circuit board 20 to insure electrical grounding of heat sink 34. Therefore, the use of heat sink 34, beyond providing for dissipation of heat generated by the electronic components, will provide both EMI protection and ESD shielding for the electronic components. In a preferred embodiment, heat sink 34 further includes a central metallic partition 36 (visible in detail in FIG. 3) which divides the package into separate regions and separate the circuitry associated with optical subassembly 22 from the electronics associated with optical subassembly 24. The isolation will thus reduce any possible electronic crosstalk between components. Although not shown in FIG. 1, a fiber connector is inserted within open end 31 of receptacle 26 to provide optical communication with the devices within package 10.

Figure 2:
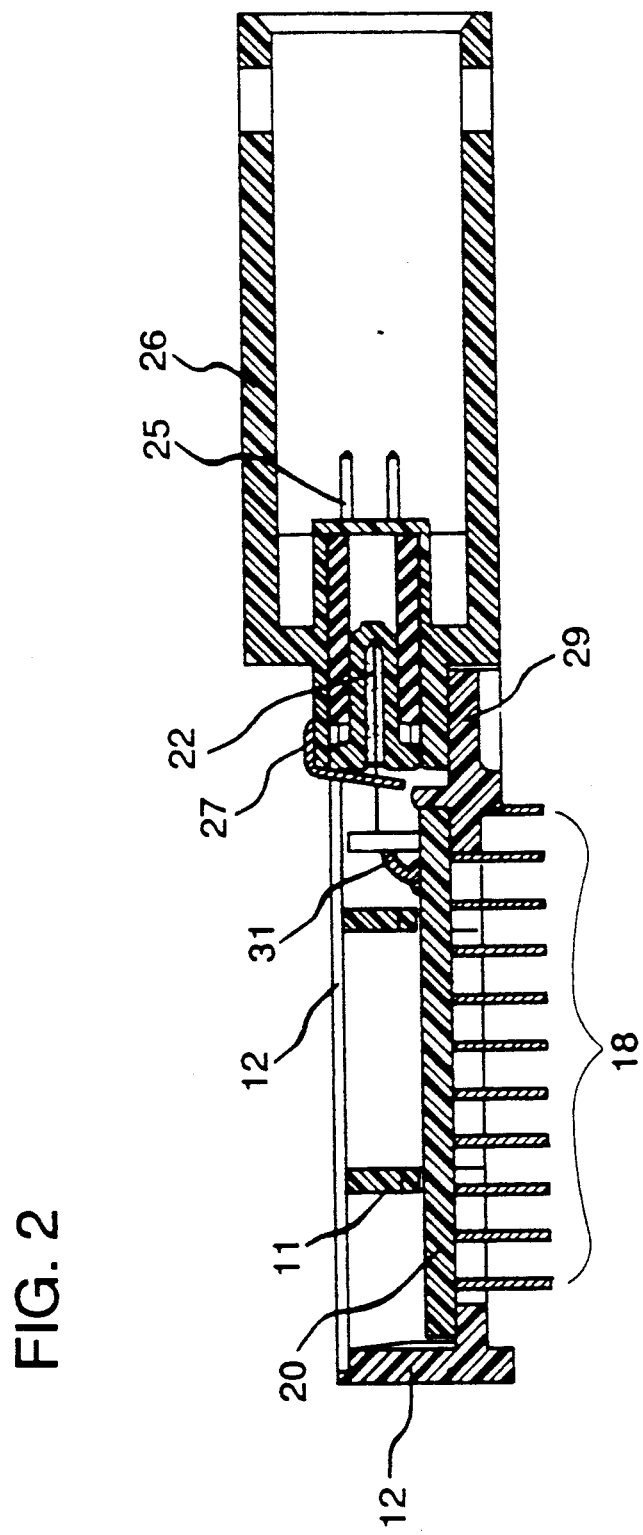
FIG. 2 is a cut-away side view in perspective of the package of FIG. 1.

FIG. 2 contains a cut-away side view of the portion of package 10 containing frame 12, electronic subassembly 16 and receptacle 26. A number of the advantages associated with various aspects of the present invention are clearly presented in this view. For example, a pair of features 11, formed in a sidewall of frame 12, are shown positioned above electronic subassembly 16. A plurality of leads 18 are shown as protruding below frame 12. Shown in detail as part of optical subassembly 22 are an optical device 19 and optical fiber 21 attached thereto. Wirebond 30 attaching device 19 to electronic subassembly 16 is also shown. A pair of power pins 25, molded into receptacle 26, are also visible in the side view of FIG. 2. It is to be understood that any required number of such power pins may be included in receptacle 26. Power pins 25, which extend through sockets 29 in frame 12 to an external power supply (not shown), may be advantageously utilized to provide electrical power to units (not shown) connected to receptacle 26. As discussed above, the electrical power may be used to drive an electronic fiber switch, control or monitoring circuitry, for example.

Figure 3:
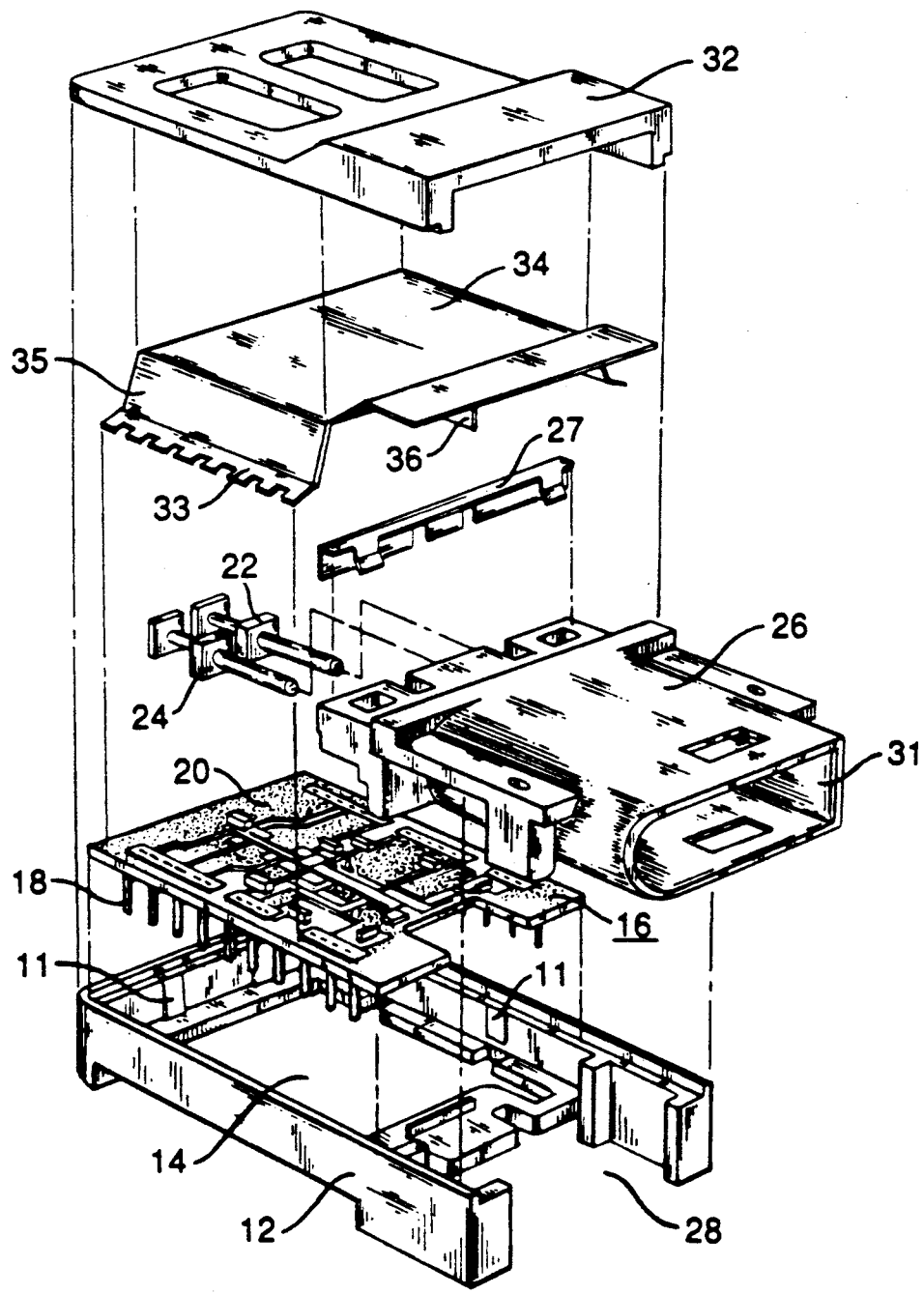
FIG. 3 illustrates a typical assembly sequence for the optical package of FIG. 1.

Referring to FIG. 3, an exemplary assembly sequence for an optical package 10 of the present invention is detailed. In particular, the assembly begins with plastic frame housing 12 which is molded to include a cavity 14 for placement of electronic subassembly 16. An advantage of this particular assembly process is that the electronics on subassembly 16 may be completely tested prior to placement of board 20 within frame 12. As shown in FIG. 3, electronic subassembly 16 may be maintained in place within frame 12 by a number of features 11, molded as part of frame 12 and located above subassembly 16.

In a separate assembly process which is not relevant to the purpose of the present invention, the optical subassemblies are formed. Basically, the optical device and fiber are coupled together and encased within a housing. As with the electronic subassembly, the optical subassemblies may then be separately tested (e.g., for optical alignment and device performance) prior to being inserted in package 10. Referring back to FIG. 3, a pair of optical subassemblies 22,24 (for example, a transmitter subassembly 22 and receiver subassembly 24) are inserted in plastic receptacle 26. Advantageously, the attachment may be secured by a metallic spring clip 27, where clip 27 may provide some additional heat sinking and EMI shielding for the optical devices. As discussed above, plastic receptacle 26 is formed of the same material as frame 12 so as to minimize subsequent problems, including differences in thermal expansion of the various piece parts. Receptacle 26, including optical subassemblies 22,24, is subsequently placed in a second cavity 28 formed in frame 12, as shown in FIG. 3. Cavity 28 is formed, as seen, to include an opening 31 for the end section 32 of receptacle 26. Once receptacle 26 is attached to frame 12, electrical leads 30 from optical subassemblies 22,24 may then be attached to electronic subassembly 16. In accordance with one advantage of the present invention, plastic receptacle 26 may be ultrasonically bonded to frame 12, where ultrasonic bonding techniques (including ultrasonic welding, staking and riveting) are considered to be faster, less expensive, and superior in quality to various other attachment schemes (for example, epoxy).

In a last series of operations, lid 32 is attached to frame 12 to complete package 10. As discussed above, lid 32 may also formed of an engineering plastic and may therefore be ultrasonically welded to frame 12. Alternatively, if lid 32 comprises a metal piece part, ultrasonic riveting or staking may be used to facilitate attachment. As discussed above, a heat sink 34 may be fit into the underside of lid 32 (for a plastic lid), or formed as part of a metallic lid 32. As discussed above, heat sink 34 includes sidewalls 35 which will contact electronic subassembly 16 when lid 32 is attached to frame 12. As seen in FIG. 3, sidewalls 35, in a preferred embodiment, include a plurality of flanged end portions 33 which are formed to provide a degree of compression between electronic subassembly 16 and lid 32 upon attachment. Additionally, element 34 may include a central partition 36 which functions to physically separate the electronics associated with subassembly 22 from the electronics associated with subassembly 24. As discussed above, heat sinking element 34 will also provide EMI protection and ESD shielding to package 10.

It is to be understood that a number of modifications to the above description may be made and are considered to fall within the scope of the present invention. For example, various other high-performance engineering plastics may be used to form frame 12, receptacle 26 and lid 32. Indeed, not all of the components must comprise the same plastic material. As mentioned above, although the package is particularly advantageous when used to house a transceiver, the package may also contain a pair of transmitting devices or a pair of receiving devices. Further, the assembly process as outlined above may be modified without altering the scope of the present invention.

I claim:

1. A lightwave communication package comprising
a pair of semiconductor optical devices;
electrical circuitry disposed on a printed circuit board including a ground plane, and associated with the operation of said pair of semiconductor optical devices; and
a lid with an underlying metallic member attached thereto, said metallic member including sidewalls for contacting the printed circuit board ground plane and providing thermal dissipation for the electrical circuitry.

2. A lightwave communication package as defined in claim 1 wherein the sidewalls include flanged end portions to facilitate connection of the lid to the package.

3. A lightwave communication package as defined in claim 1 wherein the metallic member includes a central partition for physically isolating the electrical circuitry associated with separate ones of the pair of optical devices.

4. A lightwave communication package as defined in claim 1 wherein the lid comprises a plastic material.

5. A lightwave communication package as defined in claim 4 wherein the plastic comprises a high-performance engineering plastic.

6. A lightwave communication package as defined in claim 1 wherein the lid is metallic.

7. A lightwave communication package as defined in claim 1 wherein the lid and metallic member are formed as a single unit.

8. A lightwave communication package as defined in claifn 4 wherein ultrasonic bonding is used to attach the lid to the plastic package.

* * * * *